(12) United States Patent  (10) Patent No.: US 7,943,864 B2
Kim et al.  (45) Date of Patent: May 17, 2011

(54) PRINTED CIRCUIT BOARD HAVING ELECTROMAGNETIC BANDGAP STRUCTURE

(75) Inventors: Han Kim, Yongin-si (KR); Hak-Sun Kim, Daejeon (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 408 days.

(21) Appl. No.: 12/213,291

(22) Filed: Jun. 17, 2008

(65) Prior Publication Data

US 2008/0314635 A1  Dec. 25, 2008

(30) Foreign Application Priority Data

Jun. 22, 2007 (KR) .................. 10-2007-0061833

(51) Int. Cl.
*H05K 1/11* (2006.01)
(52) U.S. Cl. ......... 174/264; 174/261; 174/262; 361/760
(58) Field of Classification Search .......... 174/250–262; 333/204, 246
See application file for complete search history.

(56) References Cited

U.S. PATENT DOCUMENTS

| 5,592,391 | A  | * | 1/1997  | Muyshondt et al. ............. 716/15 |
| 6,476,771 | B1 | * | 11/2002 | McKinzie, III ................. 343/756 |
| 6,787,895 | B1 | * | 9/2004  | Jarcy et al. ..................... 257/698 |
| 7,764,149 | B2 | * | 7/2010  | Han et al. ........................ 333/204 |
| 2005/0029632 | A1 | * | 2/2005 | McKinzie et al. ............. 257/665 |
| 2005/0205292 | A1 |   | 9/2005 | Rogers et al. |
| 2007/0090398 | A1 |   | 4/2007 | McKinzie, III et al. |
| 2010/0108373 | A1 | * | 5/2010 | Park .............................. 174/376 |

FOREIGN PATENT DOCUMENTS

JP  2002-289990  10/2002
JP  2006-302986  11/2006

OTHER PUBLICATIONS

Japanese Office Action issued Sep. 21, 2010 in corresponding Japanese Patent Application 2008-162568.

* cited by examiner

*Primary Examiner* — Yuriy Semenenko

(57) ABSTRACT

In accordance with an embodiment, the printed circuit board, having an analog circuit and a digital circuit includes: a first metal layer and a second metal layer, one of the first metal layer and the second metal layer being a power layer and the other being a ground layer; a third metal layer, layer-built between the first metal layer and the second metal layer; and a mushroom type structure including a via connected to a metal plate, the metal plate being arranged in a space between circuit patterns of the third metal layer.

9 Claims, 13 Drawing Sheets

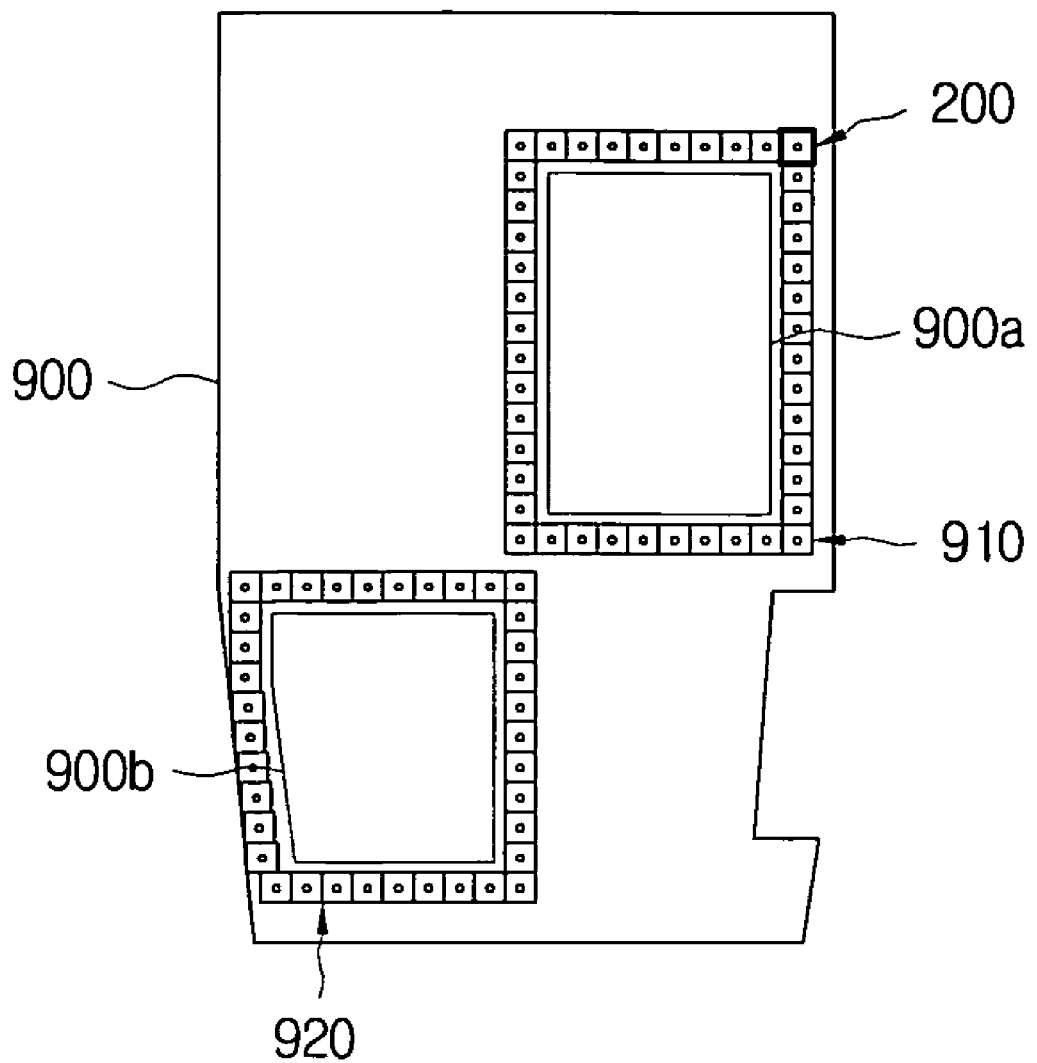

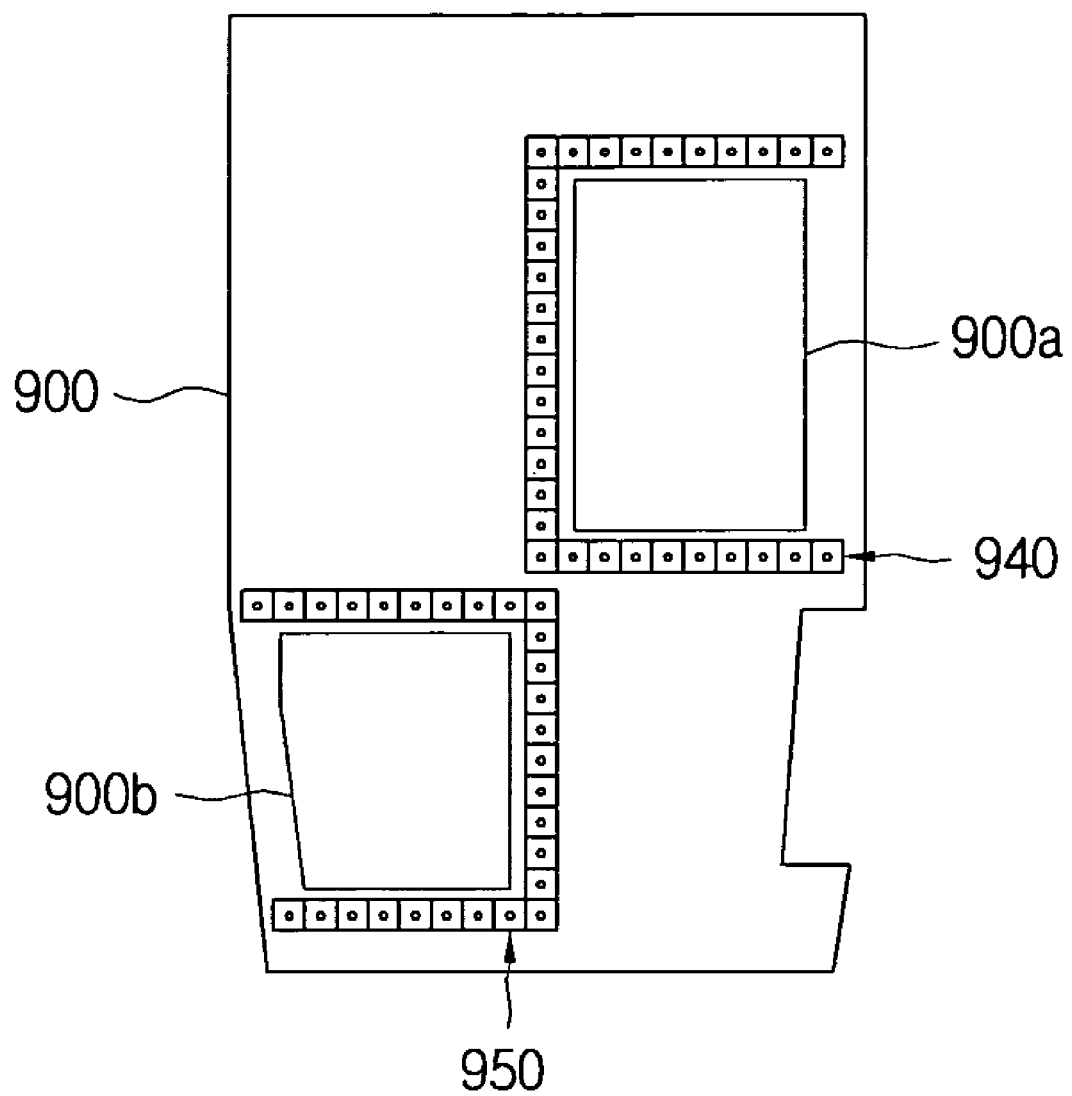

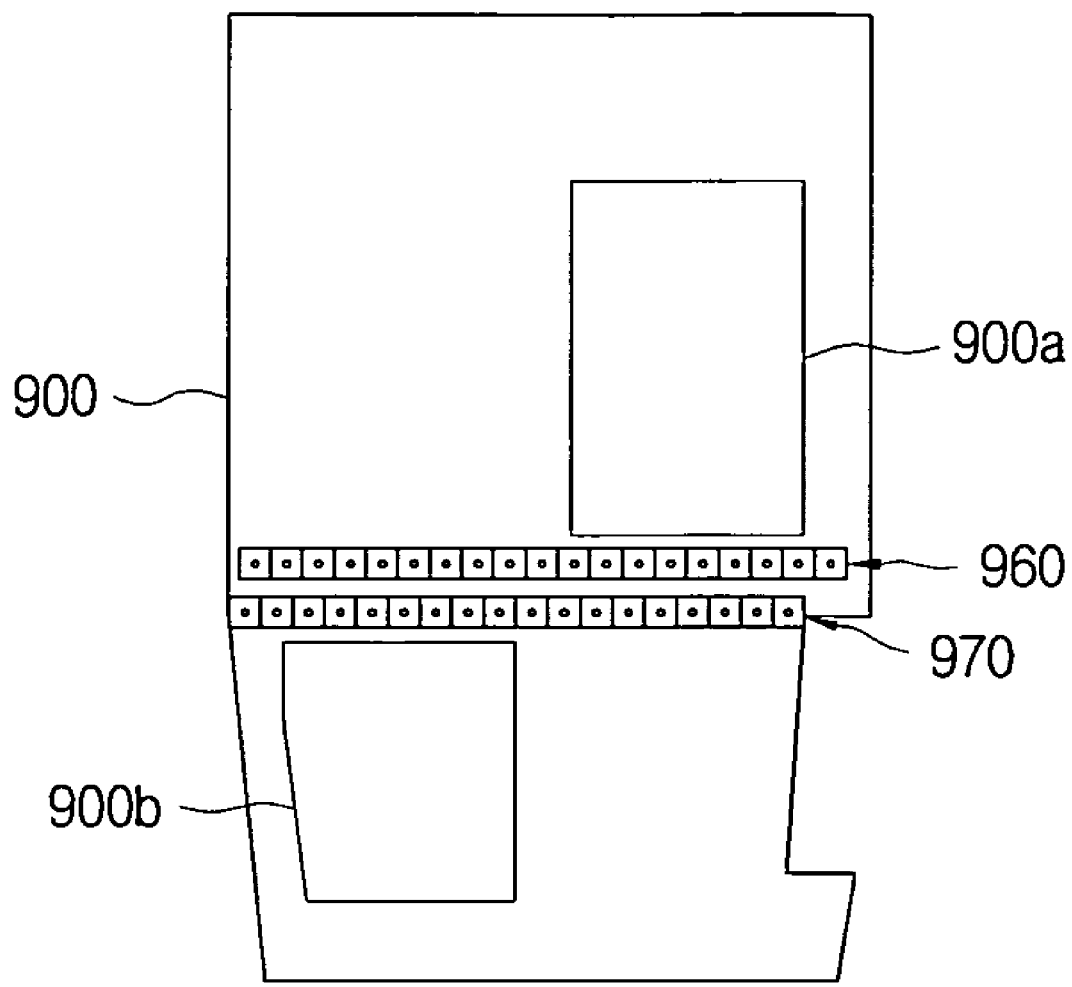

PRINTED CIRCUIT BOARD HAVING ELECTROMAGNETIC BANDGAP STRUCTURE

CROSS-REFERENCE TO RELATED PATENT APPLICATIONS

This application claims the benefit of Korean Patent Application No. 2007-0061833, filed on Jun. 22, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to a printed circuit board that includes an electromagnetic bandgap structure and solves a mixed signal problem between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards, such as 2- or 6-layered printed circuit boards, can be applied. Here, the analog circuit is assumed to be an RF circuit.

The printed circuit board 160 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer represented by reference numeral 110-2 is a ground layer and the metal layer represented by reference numeral 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem of mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

A decoupling capacitor, typical solution for the power noise, can not be a proper solution in high frequency, and study for a structure of blocking high frequency noise between the RF circuit and digital circuit is needed.

SUMMARY OF THE INVENTION

Accordingly, the present invention provides a printed circuit board that has a small size and a low bandgap frequency without increasing the number of layers because the electromagnetic bandgap structure is constructed on the same layer.

The present invention also provides a printed circuit board that can solve the mixed signal problem of a digital device such as a mobile communication device, an RF circuit and a digital circuit of which are implemented on the same board.

The present invention also provides an electromagnetic bandgap structure and a printed circuit board that can block a noise of a certain frequency.

An aspect of present invention features an printed circuit board that includes an analog circuit and a digital circuit and prevents EM wave of a certain frequency range from being transferred from the digital circuit to the analog circuit.

The printed circuit board in accordance with an embodiment of the present invention can include a first metal layer and a second metal layer, one of them is ground layer and the other is ground layer; a third metal layer, layer-built between the first metal layer and the second metal layer; and a mushroom type structure of which metal plate is arranged in a space between the circuit pattern of the third metal layer and that comprises a via connected to the metal plate.

Here, the metal plate of the mushroom type structure and the third metal layer can form a same layer.

One end of the via may be connected to the metal plate and the other end of the via may be connected to the first metal layer.

Also, the mushroom type structures that are constructed in the first metal layer, in the second metal layer and between the first metal layer and the second metal layer may form a electromagnetic bandgap structure.

The number of the mushroom type structure between the first metal layer and the second metal layer can be more than one and the mushroom type structure can be arranged in a strip structure.

The third metal layer may be divided into a first pattern area and a second pattern area by the metal plate of the mushroom type structure, and one of the first pattern area and the second pattern area may comprise the digital circuit and the other may comprise the analog circuit. Here, the first pattern area and the second pattern area may be connected to the second metal layer through the via.

Also, the strip structure may surround at least one of the digital circuit area or the analog circuit area. Here, the strip structure may be one of "[" type or "L" type or line type crossing an empty space between the digital circuit area and analog circuit area.

BRIEF DESCRIPTION OF THE DRAWINGS

FIG. 9a to FIG. 9e are various exemplary figures of printed circuit board using an electromagnetic bandgap structure arranged in a strip structure in accordance with an embodiment of the present invention.

DESCRIPTION OF THE EMBODIMENTS

Figure 1:
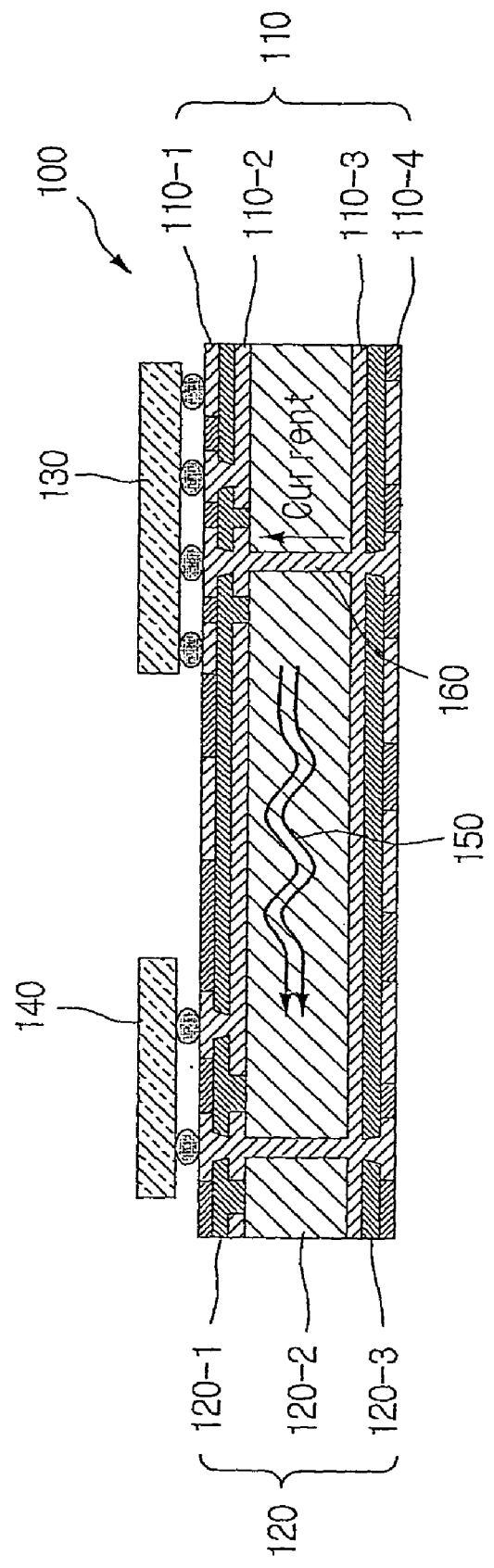
FIG. 1 is a sectional view showing a printed circuit board including an analog circuit and a digital circuit.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 2:
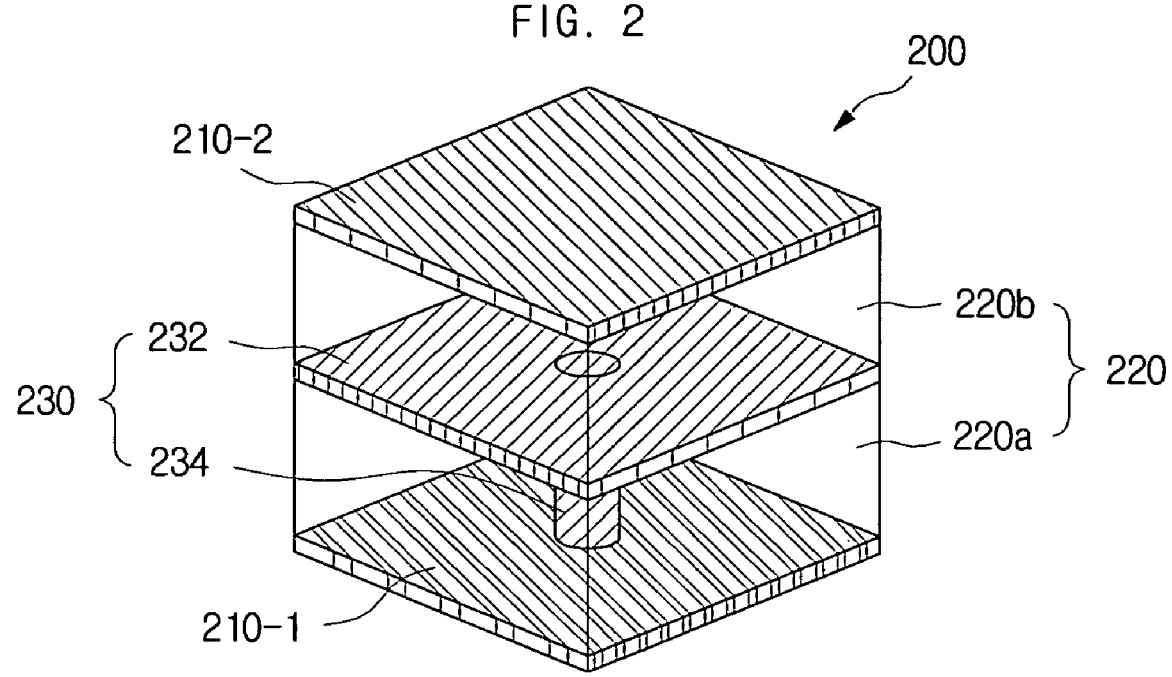
FIG. 2 is a perspective view showing an electromagnetic bandgap structure in accordance with a first embodiment of the preset invention.

FIG. 2 is a perspective view showing an electromagnetic bandgap structure, which solves a mixed signal problem between an analog circuit and a digital circuit, in accordance with a first embodiment of the preset invention.

The electromagnetic bandgap structure 200 includes a first metal layer 210-1, a second metal layer 210-2, a first dielectric layer 220a, a second dielectric layer 220b, a meal plate 232 and a via 234.

The first metal layer 210-1 and the metal plate 232 are connected to each other through the via 234. A mushroom type structure 230 is formed by the metal plate 232 and the via 234.

Between the first metal layer 210-1 and the metal plate 232, the first dielectric layer 220a is formed. Between the metal plate 232 and the second metal layer 210-2, the second dielectric layer 220b is formed. A dielectric layer 220 is divided into the first dielectric layer 220a and the second dielectric layer 220b about the metal plate 232, depending on the time the dielectric layer 220 is formed.

The first metal layer 210-1, the second metal layer 210-2, the metal plate 232 and the via 234 are made of metal, such as copper, to which power can be provided and a signal is transmitted.

The first dielectric layer 220a and the second dielectric layer 220b can be made of the same dielectric material or different dielectric materials having either the same dielectric constant or different dielectric constants.

In case the first metal layer 210-1 is a ground layer, the second metal layer 210-2 is a power layer, and in case the first metal layer 210-1 is a power layer, the second metal layer 210-2 is a ground layer. In other words, the first metal layer 210-1 and the second metal layer 210-2 are a power layer or a ground layer, respectively, with the dielectric layer 220 between them.

The first metal plate 232 is illustrated to be a square but can be a polygon, circle, oval and any other various shapes.

A method of forming electromagnetic bandgap structure 200 is as follow.

The first metal layer 210-1 and the first dielectric layer 220a are layer-built successively. For the metal plate 232 and the first metal layer 210-1, which are to be layer-built on the first dielectric layer 220a, to be connected electrically, a via, which penetrates through the first dielectric layer 220a, is formed by a drilling process.

After the via is formed, the plating process can be performed to allow a plating layer to be formed on the inner wall of the via in order to electrically connect the metal plate 232 to the first metal layer 210-1. Depending on the plating process, a plating layer can be formed on the inner wall of the via excluding the center part among the inside part of the via, or the entire inside part of the via can be completely filled. In case the inside part of the via has an empty center part, the empty center part can be filled with the dielectric material or air. The formation of via is obvious to an ordinary person skilled in the art, so detailed description thereof will be omitted.

One end of the via 234 can be connected to the metal plate 232, and the other end can be connected to the first metal layer 210-1.

After that, to connect to the via 234, the metal plate 232 is formed on the first dielectric layer 220a, and the second dielectric layer 220b and the second metal layer 210-2 are layer-built successively on the first dielectric layer 220a and the second metal layer 210-2. The metal plate is formed by using a method such as masking, exposing light, etching, photolithography and other general methods.

One or more mushroom type structures 230 including the metal plate 232 and the via 234 can be formed between the first metal layer 210-1 and the second metal layer 210-2.

The metal plate 232 of the plurality of mushroom type structures 230 can be arranged on the same planar surface or different planar surface between the first metal layer 210-a and the second metal layer 210-b. Although the via 234 of the mushroom type structure 230 is faced to the first metal layer 210-1 in FIG. 2, it is possible that the via 234 is faced to the second metal layer 210-2.

Moreover, it is possible that every via 234 of the plurality of mushroom type structures 230 is connected to the first metal layer 210-1 or the second metal layer 210-2, or the vias 234 of one group of mushroom type structures 230 are connected to the first metal layer 210-1 and vias 234 of the other are connected to the second metal layers 210-2.

By repeating the formation of the mushroom type structures 230, a bandgap structure that can block a signal included in a certain frequency band is provided.

The function of blocking a signal included in a certain frequency band is provided by the resistance (RE, RP), inductance (LE, LP), capacitance (CE, CP, CG), conductance (GP, GE) components among the first metal layer 210-1, the metal plate 232, the second metal layer 210-2 and the via 234

Out of EM waves from one side (closer to the digital circuit) to the other side (closer to the analog circuit) of the electromagnetic bandgap structure 200, the EM wave of a certain frequency is suppressed. Bandgap frequency means the frequency suppressed to not transmit the EM wave from on side to the other side of the electromagnetic bandgap structure 200. In an embodiment of the present invention, 0.8~2.0 GHz, which is the operating frequency range of an RF circuit in a mobile communication terminal, corresponds to the bandgap frequency range. By adjusting the size, the depth of the components, arrangement and other conditions, it can be designed to have an intended bandgap frequency.

Figure 3:
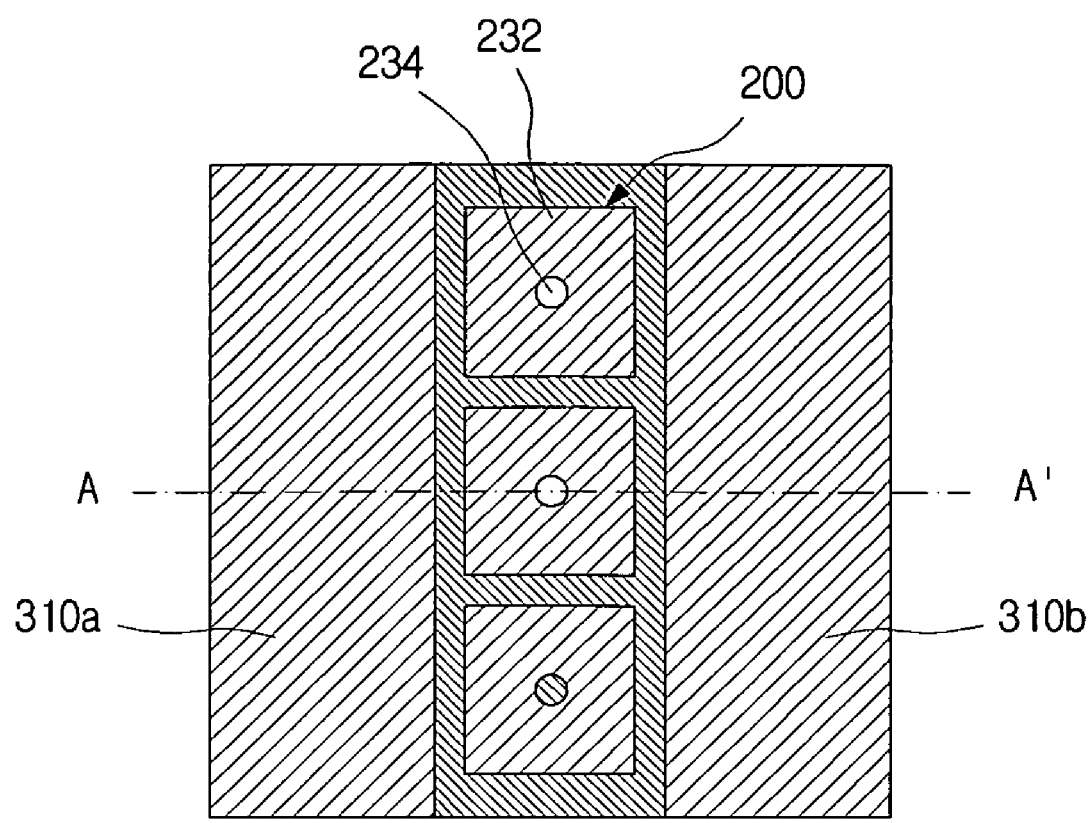
FIG. 3 is a plan view showing a metal plate configuration of the electromagnetic bandgap structure shown in a printed circuit board in accordance with an embodiment of the present invention.
Figure 4:
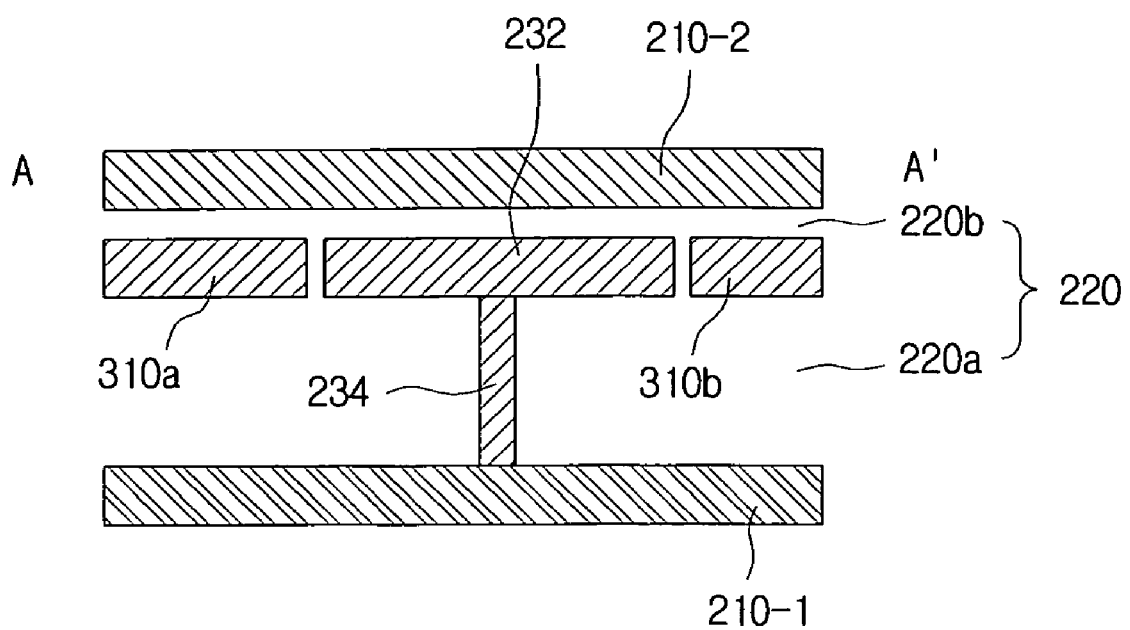
FIG. 4 is a sectional view along the A-A' line of the metal plate configuration of the electromagnetic bandgap structure illustrated in FIG. 3.

FIG. 3 is a plan view showing a metal plate configuration of the electromagnetic bandgap structure shown in a printed circuit board in accordance with an embodiment of the present invention. The plan view of FIG. 3 shows a layer including a metal layer 232. FIG. 4 is a sectional view along the A-A' line illustrated in FIG. 3.

Referring to FIG. 3, a part of a printed circuit board is illustrated, and the printed circuit board is divided into a first pattern area 310a and a second pattern area 310b by an electromagnetic bandgap structure 200. One of the first pattern area 310a and the second pattern area 310b corresponds to a digital circuit area shown in FIG. 1, and the other corresponds to an analog circuit area shown in FIG. 1.

Figure 5:
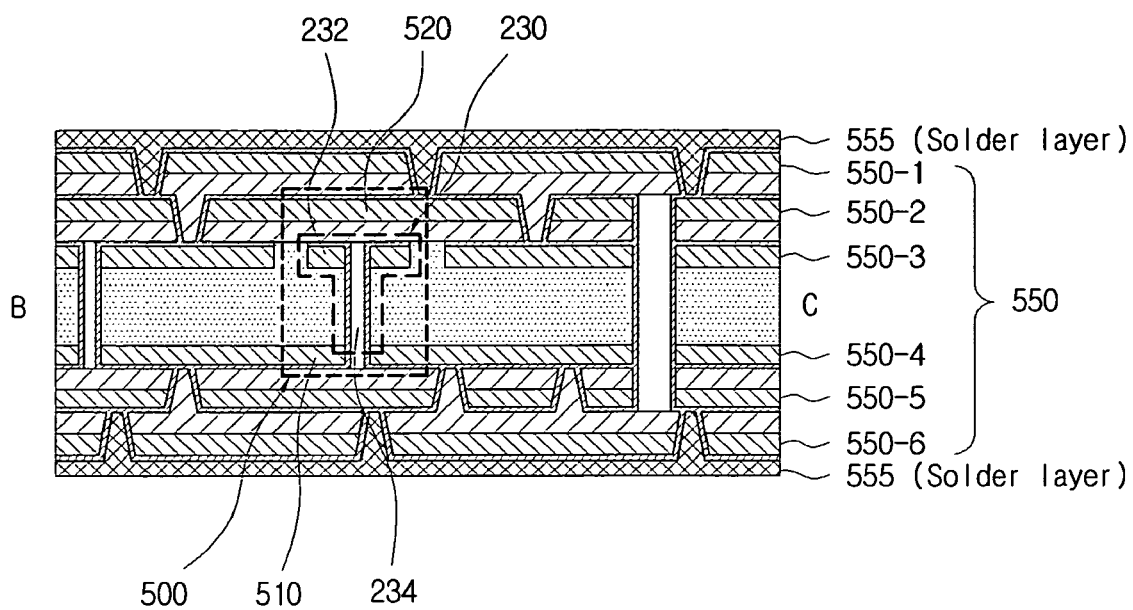
FIG. 5 is a cross sectional view illustrating an arrangement of an electromagnetic bandgap structure in a printed circuit board in accordance with an embodiment of the present invention.

FIG. 5 is a cross sectional view illustrating an arrangement of an electromagnetic bandgap structure in a printed circuit board in accordance with an embodiment of the present invention.

Referring FIG. 5, the printed circuit board includes metal layers 550-1 to 550-6 in 6-layer structure, except a solder layer 555 in a most outer part.

It is assumed that, based on the location represented by reference numeral 500, a B side is the digital circuit area and a C side is the analog circuit area. In this case, in order to minimize the transfer of a certain frequency from the digital circuit area on the B side to the analog circuit on the C side, the EM bandgap structure must be arranged inside the printed circuit board.

If the electromagnetic bandgap structure were to be installed between the closest two metal layers 550-3 and 550-4, one more layer would be added in the printed circuit board because of a mushroom type metal plate. When one more layer is added to the printed circuit board, the number of fabrication processes and the cost of fabrication are increased Therefore, in an embodiment of the present invention, the electromagnetic bandgap structure is installed not between the closest two metal layers 550-3 and 550-4 but between two metal layers 550-2 and 550-4 that include one metal layer 550-3.

The metal plate 232 of the mushroom type structure 230 in the electromagnetic bandgap structure is located on the same planar surface with the metal layer locating between the two metal layers 550-2 and 550-4, and it is possible to be constructed with metal plate 550-3 at the same time, so the number of fabrication processes is not increased.

Referring to the reference numeral 500, the mushroom type structure 230 consisting of the metal plate 232 and the via 234 is included inside, and the metal layers 520 and 510 that are part of the two metal layer 550-2 and 550-4 are arranged above and below the mushroom type structure 230, and the electromagnetic bandgap structure is constructed as in FIG. 2

Therefore, in an embodiment of the present invention, the electromagnetic bandgap structure is arranged in an empty space between the digital circuit area (the B side) and the analog circuit area (the C side) of the metal layers of the printed circuit board to solve the mixed signal problem.

And the electromagnetic bandgap structure is arranged in line in an empty space between the digital circuit area (the B side) and the analog circuit area (the C side), as illustrated in FIG. 3. Because of the linear arrangement, the EM wave forwarding from the digital circuit area (the B side) to the analog circuit area (the C side) passes through at least one electromagnetic bandgap structure, minimizing the transmission of a certain frequency range signal.

Figure 6:
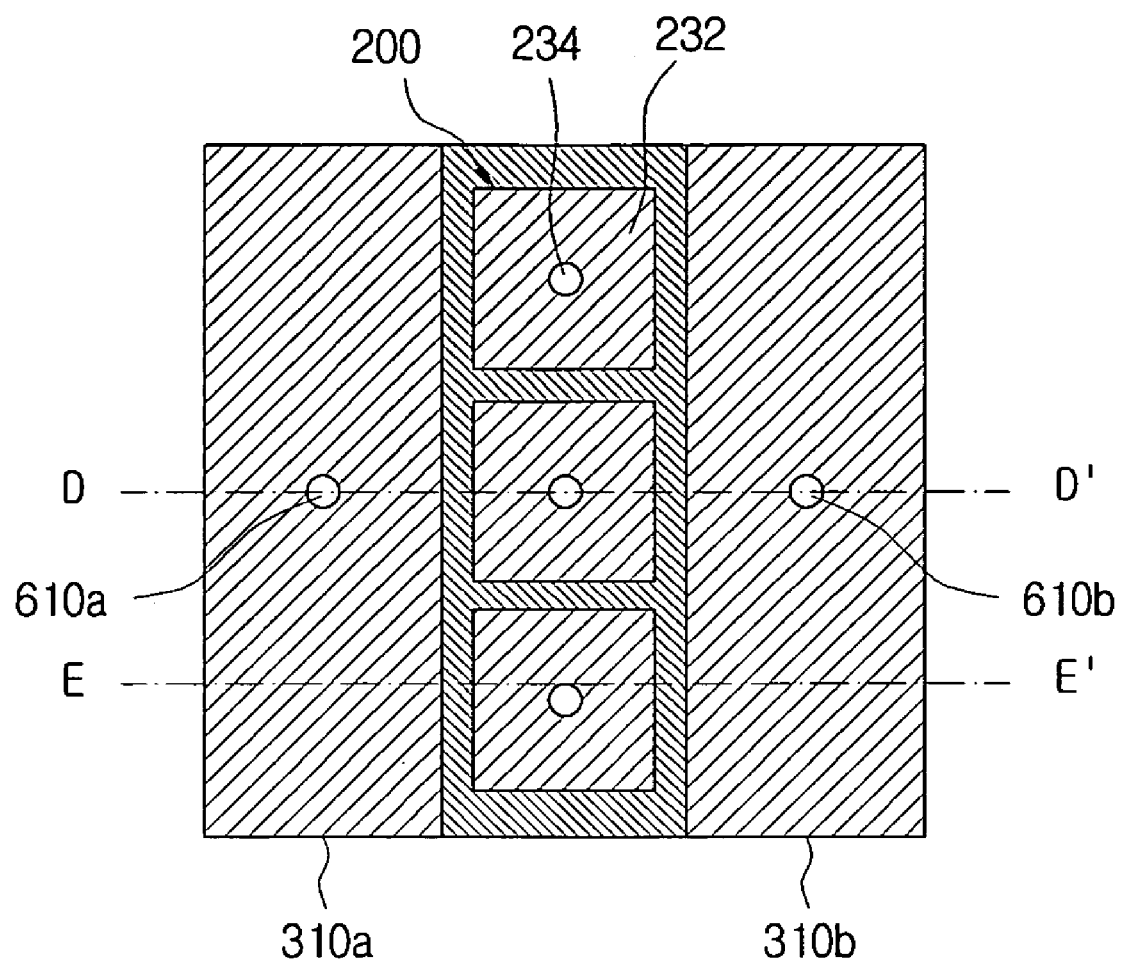
FIG. 6 illustrates a plan view of a metal plate arrangement of an electromagnetic bandgap structure in accordance with another embodiment of the present invention.
Figure 7:
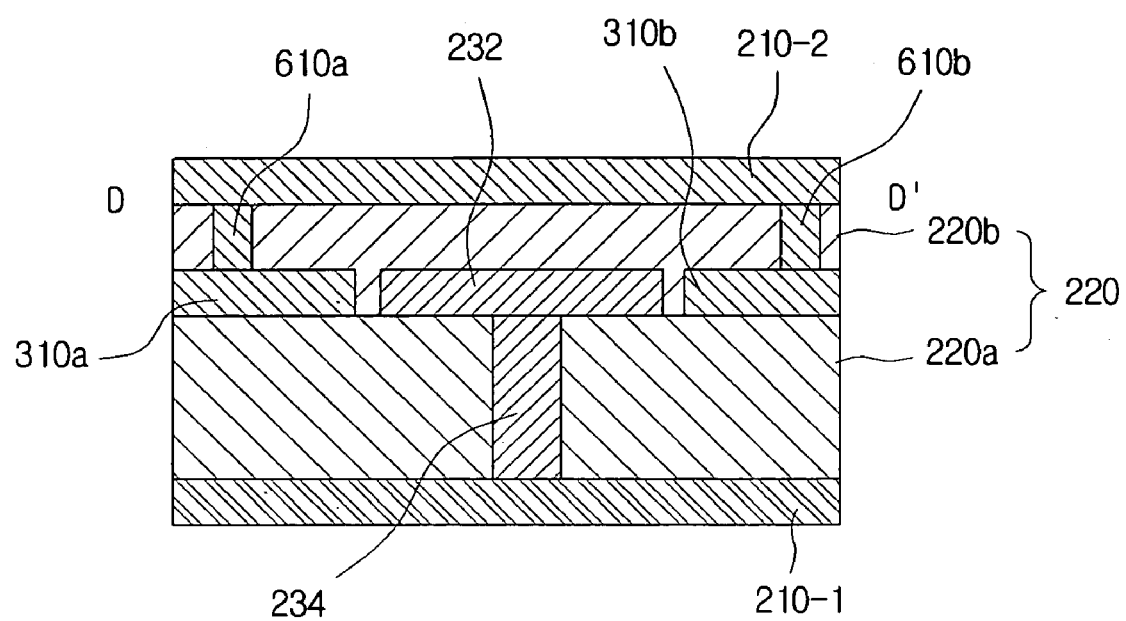
FIG. 7 is a sectional view showing an electromagnetic bandgap structure along the D-D' line of FIG. 6.
Figure 8:
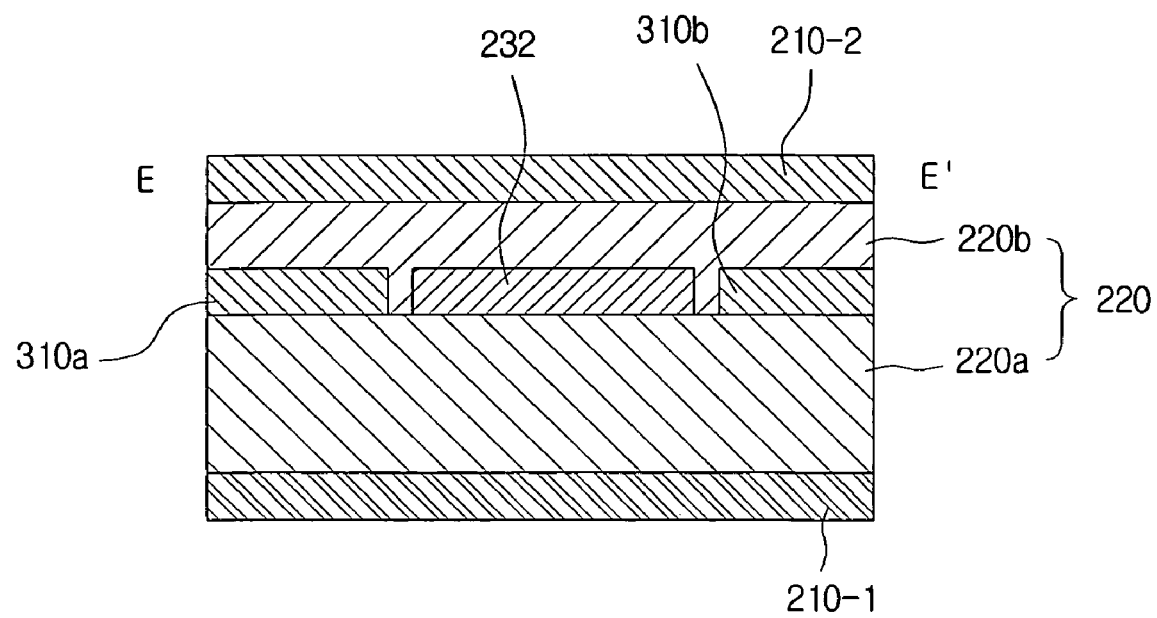
FIG. 8 is a sectional view along the E-E' line of FIG. 6.

FIG. 6 illustrates a plan view of a metal plate arrangement of an electromagnetic bandgap structure in accordance with another embodiment of the present invention. The plan view of FIG. 6 shows a layer including the metal layer 232. FIG. 7 is a sectional view showing an electromagnetic bandgap structure along the D-D' line of FIG. 6, and FIG. 8 is a sectional view along the E-E' line of FIG. 6

The electromagnetic bandgap structure 200 is arranged in a strip structure in an empty space between the first pattern area 310a and the second pattern area 310b. Here, the empty space means the space that is between the circuit patterns formed on a predetermined metal layer and is not used for any function of the printed circuit board. One of the first pattern area 310a and the second pattern area 310b corresponds to the digital circuit pattern, and the other corresponds to the analog circuit pattern. The first pattern area 310a is connected to the second metal layer 210-2 through a first area via 610a, and the second pattern area 310b is connected to the second metal layer 210-2 through a second area via 610b.

Here, in case the first metal layer 210-1 is a power layer and the second metal layer 210-2 is a ground layer, the via 234 of the mushroom type structure is a power via connected to the first metal layer 210-1 and the first area via 610a and the second area via 610b are ground vias. On the other hand, in case the first metal layer 210-1 is a ground layer and the second metal layer 210-2 is a power layer, the via 234 of the mushroom type structure is a ground via connected to the first metal layer 210-1 and the first area via 610a and the second area via 610b are power vias. In other words, the characteristics of the via 234 of the mushroom structure are different from those of the first area via 610a and the second area via 610b.

FIG. 9a to FIG. 9e are various exemplary figures of a printed circuit board using an electromagnetic bandgap structure arranged in a strip structure in accordance with an embodiment of the present invention.

A typical example of the printed circuit board 900 having both the digital circuit and the analog circuit is a cellular phone board. The cellular phone includes a microwave transceiver that transmits a microwave signal to the outside and receives a microwave signal from the outside. Here, the microwave transceiver corresponds to the analog circuit. The cellular phone also includes a digital circuit that converts the received microwave signal to a digital signal and processes the picture and voice. Therefore, the cellular phone board has both the digital circuit and analog circuit and corresponds to one example of the printed circuit board applied with an electromagnetic bandgap structure arranged in a strip structure in accordance with an embodiment of the present invention. Besides the cellular phone board, it shall be evident that the following description can be applied to any board that has both the digital circuit and the analog circuit to transmit a certain frequency range signal forwarding from the digital circuit to the analog circuit.

A printed circuit board 900 has both a digital circuit area 900a and an analog circuit area 900b. The digital circuit area 900a and analog circuit area 900b are spaced apart from each other with a specific gap, and the mixed signal is transferred from the digital circuit to the analog circuit through various routes. As such, methods of arranging the electromagnetic bandgap structure to block the mixed signal from being transferred are illustrated in FIGS. 9a to 9e.

Referring to FIG. 9a, the digital circuit area 900a and the analog circuit area 900b are surrounded by a close loop arrangement of an electromagnetic bandgap structure that has a first arrangement 910 and a second arrangement. For an EM wave to be transferred from the digital circuit area 900a to the analog circuit area 900b, the EM wave may pass through the close loop type first arrangement 910 and second arrangement 920 and at least two electromagnetic bandgap structures 200.

Here, there can be the first arrangement 910 only without the second arrangement 920, or there can be the second arrangement 920 only without the first arrangement 910. In this case, for the EM wave in the digital circuit area 900a to be transferred to the analog circuit area 900b, the close loop type of one of the first arrangement 910 and the second arrangement 920 must be passed through and at least one electromagnetic bandgap structure 200 must be passed through.

Figure 9B:
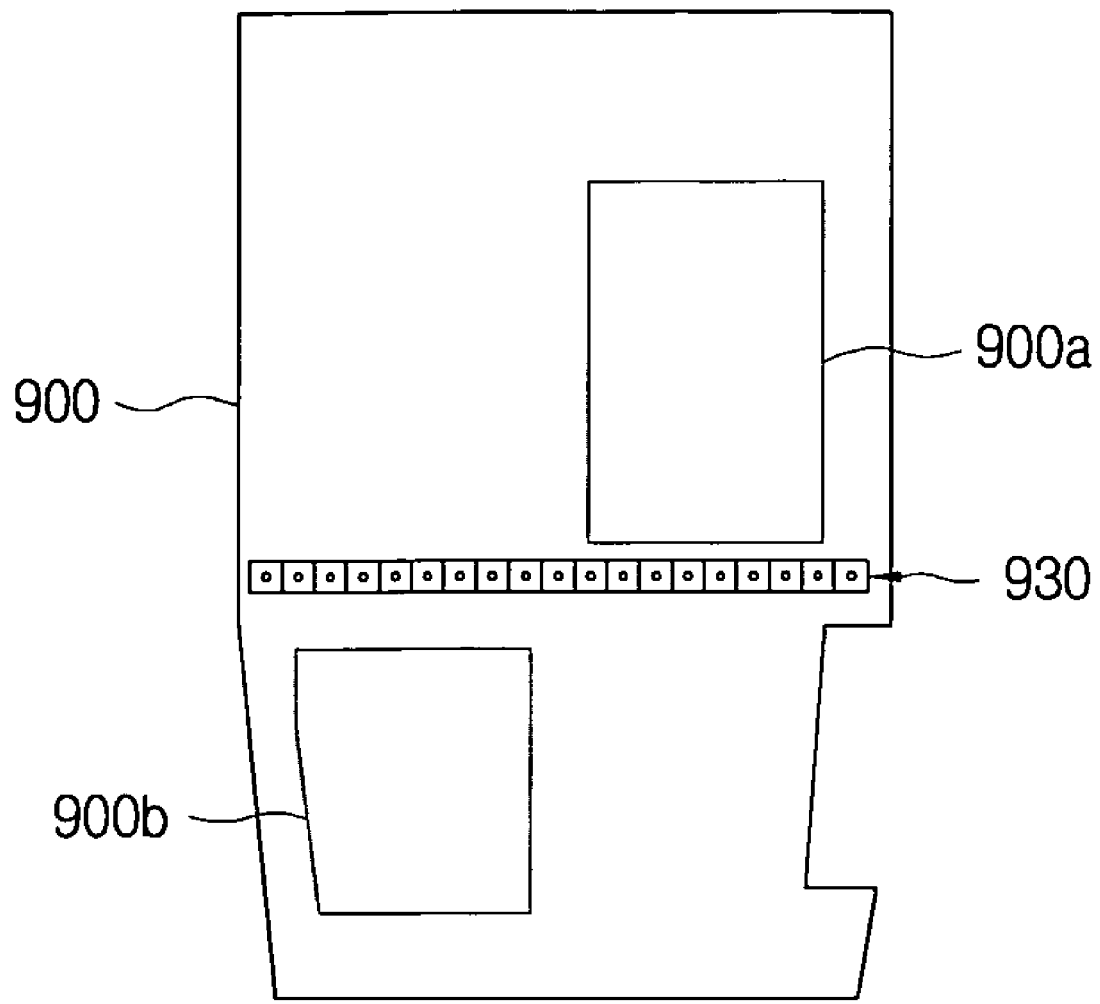

Referring to FIG. 9b, the electromagnetic bandgap structure 200 is arranged in a third arrangement 930 type, the line crossing an empty space between the digital circuit area 900a and the analog circuit area 900b. For an EM wave to be transferred from the digital circuit area 900a to the analog circuit area 900b, the line type of the third arrangement 930 must be passed through and at least one electromagnetic bandgap structure 200 must be passed through.

Referring to FIG. 9c, the electromagnetic bandgap structure 200 is arranged in a bracket ("[") shape in the empty space between the digital circuit area 900a and analog circuit area 900b in a fourth arrangement 940 and a fifth arrangement 950 type. For an EM wave to be transferred from the digital circuit area 900a to the analog circuit area 900b, the bracket ("[") shape of the fourth arrangement 940 and the fifth arrangement 950 must be passed through and at least two electromagnetic bandgap structures 200 must be passed through.

Here, there can be the fourth arrangement 940 only without the fifth arrangement 950, or there can be the fifth arrangement 950 only without the fourth arrangement 940. In this case, for the EM wave in digital circuit area 900a to be transferred to the analog circuit area 900b, the close loop type of one of the fourth arrangement 940 and the fifth arrangement 950 must be passed through and at least one electromagnetic bandgap structure 200 must be passed through.

Referring to FIG. 9d, the electromagnetic bandgap structure 200 is arranged in a sixth arrangement 960 and a seventh arrangement 970 types, which are two lines crossing the empty space between the digital circuit area 900a and analog circuit area 900b. For an EM wave to be transferred from the digital circuit area 900a to the analog circuit area 900b, the two linear sixth arrangement 960 and seventh arrangement 970 must be passed through and at least two electromagnetic bandgap structures 200 must be passed through.

Figure 9E:
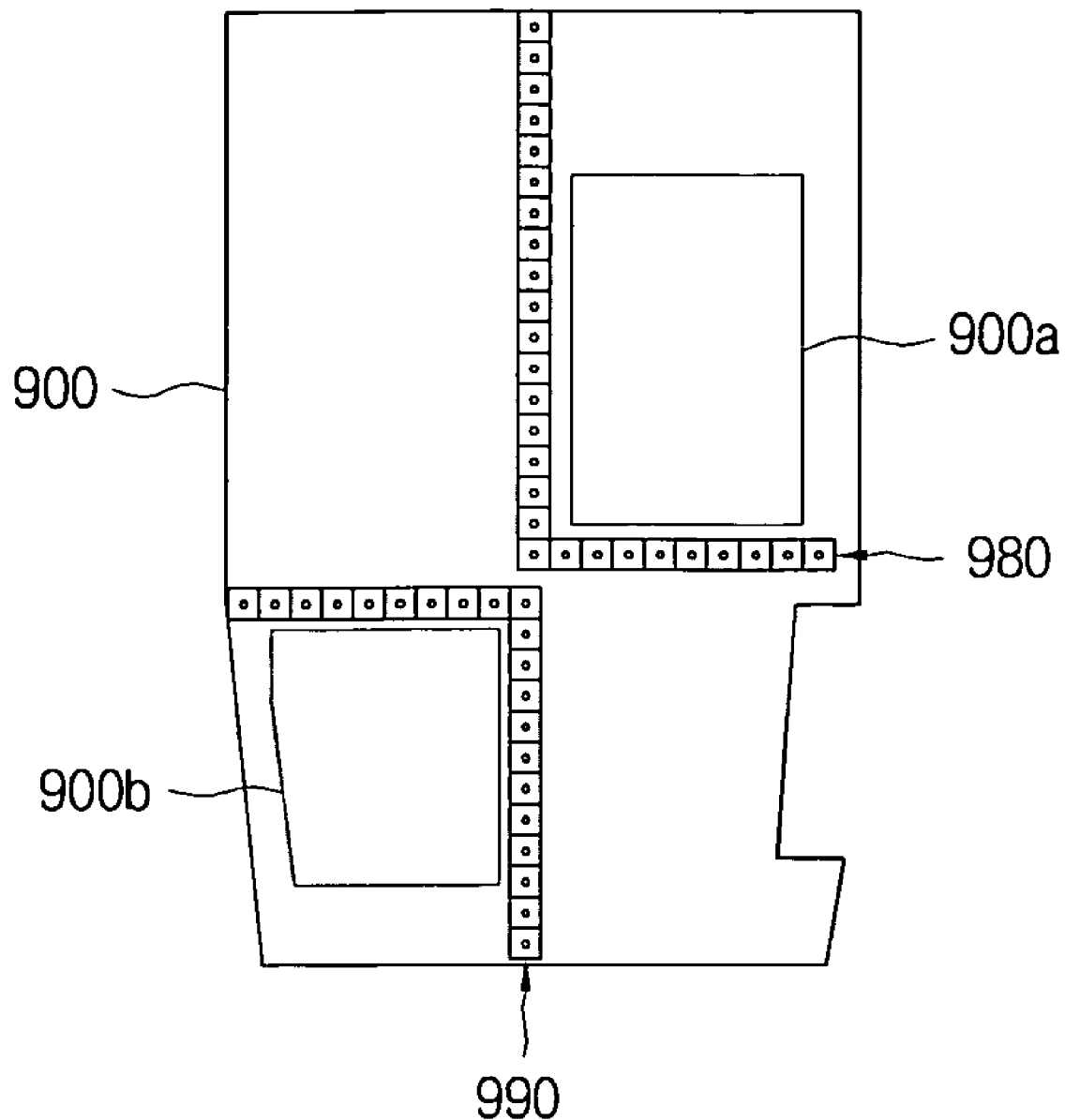

Referring to FIG. 9e, the electromagnetic bandgap structure 200 is arranged in an eighth arrangement 980 and a ninth arrangement 990 types, which are in a form of "L" in the empty space between the digital circuit area 900a and analog circuit area 900b. For an EM wave to be transferred from the digital circuit area 900a to the analog circuit area 900b, the "L" type eighth arrangement 980 and ninth arrangement 990 must be passed through and at least two electromagnetic bandgap structures 200 must be passed through.

Here, there can be the eighth arrangement 980 only without the ninth arrangement 990, or there can be the ninth arrangement 990 only without the eighth arrangement 980. In this case, for the EM wave in digital circuit area 900a to be transferred to the analog circuit area 900b, the close loop type of one of the eighth arrangement 980 and the ninth arrangement 990 must be passed through and at least one electromagnetic bandgap structure 200 must be passed through.

By arranging the electromagnetic bandgap structure 200 in a strip structure, as described above, the bandgap frequency signal out of the EM wave from the digital circuit area 900a to the analog circuit area 900b is suppressed from being transferred and the mixed signal problem in the analog circuit is prevented.

It shall be also evident to those who are skilled in the art that, besides the strip structure described above, any arrangement structure that can block the transfer of a signal from a digital circuit area 900a to an analog circuit area 900b belongs to the claim of the present invention.

Moreover, although the electromagnetic bandgap structure 200 illustrated in FIG. 2 has been described, the present invention can apply to any structure that has the functionality of minimizing the transfer of a certain frequency signal from one end to the other end.

The printed circuit board in accordance with an embodiment of the present invention includes an analog circuit and a digital circuit. An analog circuit can be an RF circuit, such as an antenna that receives an RF signal from the outside.

By arranging the above electromagnetic bandgap structures 300 and 400 inside, the printed circuit board in which both the analog circuit and the digital circuit are implemented concurrently can prevent the EM wave of a certain frequency range (for example, 0.8~2.0 GHz) from being transferred.

Therefore, despite the small size, it is possible to solve the aforementioned mixed signal problem by preventing the EM wave of a certain frequency range, which corresponds to a noise, from being transferred.

As described above, in accordance with the present invention, an electromagnetic bandgap structure can be applied without increasing the number of layers because the electromagnetic bandgap structure is constructed on the same layer as the power layer or the ground layer. For this, the mushroom type structure is constructed in a strip structure.

Although some embodiments of the present invention have been shown and described for the above-described objects, it shall be appreciated by any person of ordinary skill in the art that a large number of modifications, permutations and additions are possible within the principles and spirit of the invention, the scope of which is defined by the appended claims and their equivalents.

What is claimed is:

1. A printed circuit board having an analog circuit and a digital circuit, comprising:
   a first metal layer and a second metal layer, one of the first metal layer and the second metal layer being a power layer and the other of the first metal layer and the second metal layer being a ground layer;
   a third metal layer, layer-built between the first metal layer and the second metal layer;
   a mushroom type structure including a first via connected to a metal plate, the metal plate being arranged in a space between circuit patterns of the third metal layer; and second and third vias,
   the metal plate and the third metal layer forming a same layer,
   the third metal layer being divided into a first pattern area and a second pattern area by the metal plate,
   the first pattern area and the second pattern area being connected to the second metal layer respectively through the second and third vias, and
   the mushroom type structure being electrically separated from each of the first and the second pattern areas.

2. The printed circuit board of claim 1, wherein one end of the first via is connected to the metal plate and an other end of the first via is connected to the first metal layer.

3. The printed circuit board of claim 1, wherein the first metal layer, the second metal layer and the mushroom type structure formed between the first metal layer and the second metal layer form an electromagnetic bandgap structure.

4. The printed circuit board of claim 1, wherein a plurality of the mushroom type structures are arranged in a strip structure between the first metal layer and the second metal layer.

5. The printed circuit board of claim 4, wherein one of the first pattern area and the second pattern area comprises the digital circuit and the other of the first pattern area and the second pattern area comprises the analog circuit.

6. The printed circuit board of claim 4, wherein one of the first pattern area and the second pattern area is a digital circuit area, and the other of the first pattern area and the second pattern area is an analog circuit area, and the strip structure surrounds at least one of the digital circuit area and the analog circuit area.

7. The printed circuit board of claim 6, wherein the strip structure has one of a closed-loop shape, a bracket ("[") shape and an "L" shape.

8. The printed circuit board of claim 6, wherein the strip structure is a line type crossing an empty space between the digital circuit area and the analog circuit area.

9. The printed circuit board of claim 1, wherein the first via is a power via, and the second and third vias are ground vias.

* * * * *